(12) United States Patent
Lukanc

(10) Patent No.: US 6,184,114 B1
(45) Date of Patent: Feb. 6, 2001

(54) MOS TRANSISTOR FORMATION

(75) Inventor: Todd Lukanc, San Jose, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/375,503

(22) Filed: Aug. 17, 1999

(51) Int. Cl.$^7$ ................................................ H01L 21/3205

(52) U.S. Cl. .......................... 438/585; 438/197; 438/303; 438/595

(58) Field of Search .................................... 438/197, 294, 438/303, 585, 595, 289

(56) References Cited

U.S. PATENT DOCUMENTS

| | | | |
|---|---|---|---|
| 5,960,270 | * | 9/1999 | Misra et al. .......................... 438/197 |
| 6,051,470 | * | 4/2000 | An et al. .............................. 438/283 |

* cited by examiner

*Primary Examiner*—Trung Dang

(57) ABSTRACT

Semiconductor devices of different conductivity types with optimized gate electrodes are formed on a semiconductor substrate by replacing the initial gate electrode and, optionally, the underlying gate oxide layer. Embodiments include forming a first gate electrode on a gate oxide layer and replacing the gate electrode with a second gate electrode. Optionally, a second dielectric layer can be deposited in place of or in addition to the gate oxide layer prior to depositing the second gate electrode.

20 Claims, 5 Drawing Sheets

MOS TRANSISTOR FORMATION

FIELD OF THE INVENTION

The present invention relates to a method of manufacturing a semiconductor device on a semiconductor substrate. The invention has particular applicability in manufacturing a plurality of semiconductor devices of different conductivity types on a single substrate.

BACKGROUND ART

Fabrication of a semiconductor device and an integrated circuit thereof begins with a semiconductor substrate and employs film formation, ion implantation, photolithographic, etching and deposition techniques to form various structural features in or on the substrate to attain individual circuit components which are then interconnected to ultimately form an integrated semiconductor device. Escalating requirements for high densification and performance associated with ultra large-scale integration (ULSI) semiconductor devices requires smaller design features, increased transistor and circuit speeds, high reliability and increased manufacturing throughput for competitiveness. As the devices and features shrink, and as the drive for higher performing devices escalates, new problems are discovered that require new methods of fabrication or new arrangements or both.

There is a demand for large-scale and ultra large-scale integration devices employing high performance metal-oxide-semiconductor (MOS) devices. MOS devices typically comprise a pair of ion implanted source/drain regions in a semiconductor substrate and a channel region separating the source/drain regions. Above the channel region is a thin gate oxide and a conductive gate comprising conductive polysilicon or another conductive material. In a typical integrated circuit, a plurality of MOS devices of different conductivity types, such as n-type and p-type, and complementary MOS (CMOS) devices employing both p-channel and n-channel devices are formed on a common substrate. MOS technology offers advantages of significantly reduced power density and dissipation as well as reliability, circuit performance and cost advantages.

FIG. 1 illustrates a cross-sectional portion of an exemplary CMOS structure comprising a doped semiconductor substrate 10 typically of monocrystalline silicon of a first conductivity type (p or n). The CMOS structure further comprises field oxide area 12, gate oxide layer 14, conductive gate electrodes 16 and 18, typically of polysilicon, formed over gate oxide layer 14, and stepped source and drain regions 20 and 22 which include lightly or moderately doped shallow extensions 20A and 22A. Completing the MOS transistor precursor structure are insulative sidewall spacers 24A through 24D, formed on the side surfaces of each of gate electrodes 16 and 18.

The general steps in fabricating conventional MOS devices of different conductivity types on a single substrate are summarized in FIG. 2 with respect to the structure illustrated in FIG. 1. The process begins with a highly polished substrate of monocrystalline silicon where field oxide area 12 is formed, as by local oxidation of silicon (LOCOS) or shallow trench isolation (STI), in semiconductor substrate 10. Thin gate oxide 14 is thermally grown from about 25 Å to about 50 Å thick, and conductive gate electrodes 16 and 18 are formed from polysilicon at about 1200 Å to about 2000 Å thick. A photoresist mask is thereafter formed on the areas to be subsequently implanted, and substrate 10 is implanted, as by ion implantation, with n-type impurities to form lightly or moderately doped (NLDD) regions 20A, also called shallow source/drain extensions. The mask is then removed, and the areas previously implanted with impurities NLDD are masked with a second photoresist mask. Substrate 10 is thereafter implanted, as by ion implantation, with p-type impurities to form lightly or moderately doped (PLDD) regions 22A.

The second photoresist mask is then removed and sidewall spacers 24A through 24D are formed on the side surfaces of the gate electrodes 16 and 18, as by depositing a blanket layer of a dielectric material, such as silicon nitride, and anisotropically etching the dielectric material. A third photoresist mask is thereafter formed on the regions implanted with p-type impurities, and substrate 10 is implanted, as by ion implantation, with n-type impurities to form source/drain (NS/D) regions 20, which include lightly or moderately doped regions 20A. The third mask is then removed, and the areas previously implanted with impurities NS/D are masked with a fourth photoresist mask and substrate 10 is thereafter implanted, as by ion implantation, with p-type impurities to form source/drain (PS/D) regions 22, which include regions 22A. Upon removal of the final mask, the structure shown in FIG. 1 remains.

Source/drain implants NS/D, PS/D are typically implanted at a higher energy and dosage than lightly or moderately doped implants NLDD, PLDD, so source/drain implants NS/D, PS/D penetrate deeper into substrate 10 than lightly or moderately doped implants NLDD, PLDD. Additionally, sidewall spacers 24A through 24D prevent moderate or heavy source/drain implants NS/D, PS/D from penetrating substrate 10 adjacent to or under gate electrodes 16 and 18 to obtain the desired device performance characteristics. Thus, source/drain regions 20 and 22 have a step corresponding to spacers 24A through 24D. After the implantation process, the substrate is heated to diffuse and electrically activate the implants to form the heavily doped contact regions in the substrate. This annealing, drive-in process comprises heating the implanted substrate for a short period of time at a moderate temperature 900° C. to about 1100° C.

Additional process steps, such as the formation of metal contacts to electrically connect various features, formation of insulative layers to isolate the various features, and formation of inter-level metallization, complete and integrate the device.

The high temperatures needed during conventional source/drain formation precludes the use of materials, particularly gate electrode materials, that would melt, decompose, or otherwise adversely affect the process. Hence, conventional techniques for forming MOS devices involve a complex series of steps each of which precludes the use of certain materials.

Of particular importance in MOS devices is the composition and dimensional accuracy of the gate electrode structure, which includes the gate electrode and the underlying gate oxide. The gate electrode's thickness, length, composition, etc. are critical since the gate electrode controls the flow of electrons and is vital to proper device operation, particularly as the dimensions of device features are reduced into the sub-micron range. However, the gate electrode dimensions is limited by the resolution of the photolithographic process. Moreover, the choice of useful materials that can serve as a conductive gate electrode and underlying dielectric layer is limited to the those materials which can withstand the complex and extreme processing steps in the manufacture of MOS transistors, e.g. polysilicon and silicon dioxide, respectively.

Hence, it would be highly advantageous to develop a process which would permit the use of optimum materials in the formation of the gate electrode structure. It would also be highly advantageous to develop methodologies capable of optimum MOS transistor formation. Accordingly, there exists a need for a method of manufacturing MOS semiconductor devices with a reduced dimensional gate structure and/or optimum materials that improves device performance.

SUMMARY OF THE INVENTION

An advantage of the present invention is a method of accurately controlling the dimensions of a gate electrode in MOS devices and a method for selecting optimum materials for the gate electrode and underlying dielectric layer.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of forming a gate electrode. The method comprises: forming a first gate electrode on a substrate, wherein the first gate electrode has an upper surface; depositing an insulating layer to protect the substrate; removing the first gate electrode; and forming a second gate electrode in place of the first gate electrode. Advantageously, the first gate electrode can be selectively removed, as by reactive ion etching, while preserving the remaining layers necessary in the formation of a MOS device. Thereafter, a second gate electrode can be optimally deposited.

Another aspect of the present invention is a method of manufacturing a semiconductor device. The method comprises: depositing a first dielectric layer on a substrate; forming a first gate electrode on the dielectric layer, wherein the first gate electrode has an upper surface; depositing an insulating material to protect the substrate; removing the first gate electrode; and forming a second gate electrode in place of the first gate electrode.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for manufacturing MOS semiconductor devices employ particular materials for the gate electrode and underlying dielectric layer. The choice of materials is limited to those capable of withstanding a variety of processing conditions while maintaining their integrity and the integrity of adjacent layers. Moreover, the dimensional accuracy and resolution of MOS devices is limited to the conventional photolithographic techniques. The present invention addresses and solves these problems stemming from conventional complex manufacturing processes, while maintaining the ability to optimize device performance by replacing the conventional gate electrode with a second gate electrode after formation of a precursor MOS device.

Embodiments of the present invention include forming a first gate electrode on the surface of a semiconductor substrate, forming an insulating layer on the substrate to protect and isolate the first gate electrode, and replacing the first gate electrode with the second gate electrode. As used throughout the present disclosure and claims, the term "substrate" includes a semiconductor substrate or an epitaxial layer formed on the semiconductor substrate.

Figure 1:
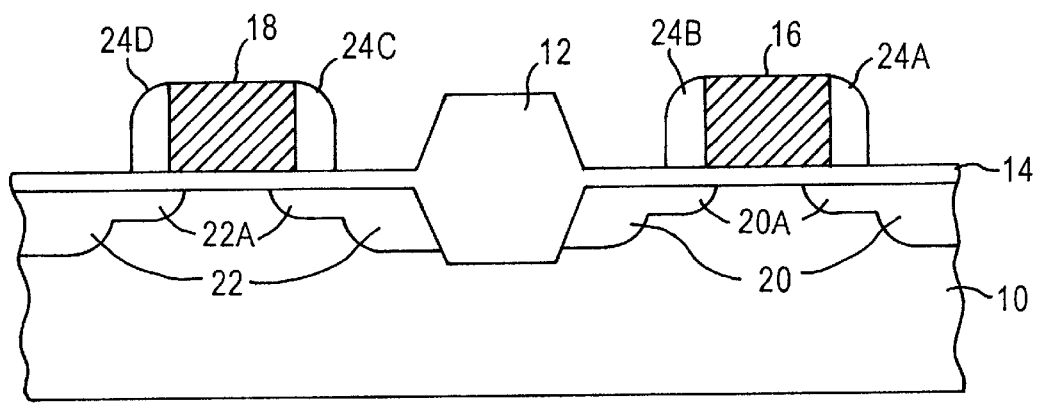
FIG. 1 schematically illustrates a conventional CMOS semiconductor device.
Figure 2:
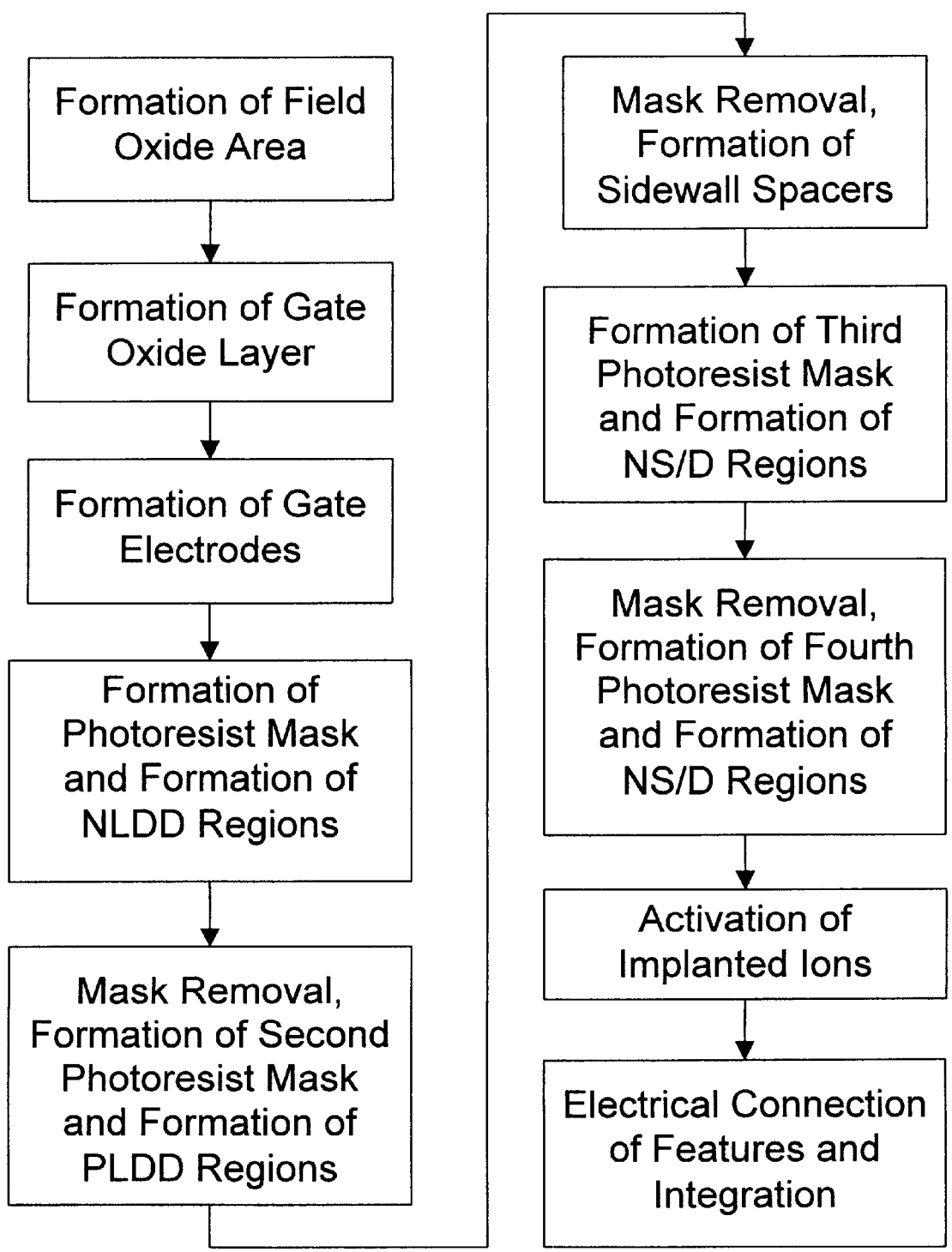
FIG. 2 is a flow diagram summarizing a conventional method of forming a CMOS semiconductor device.
Figure 3:
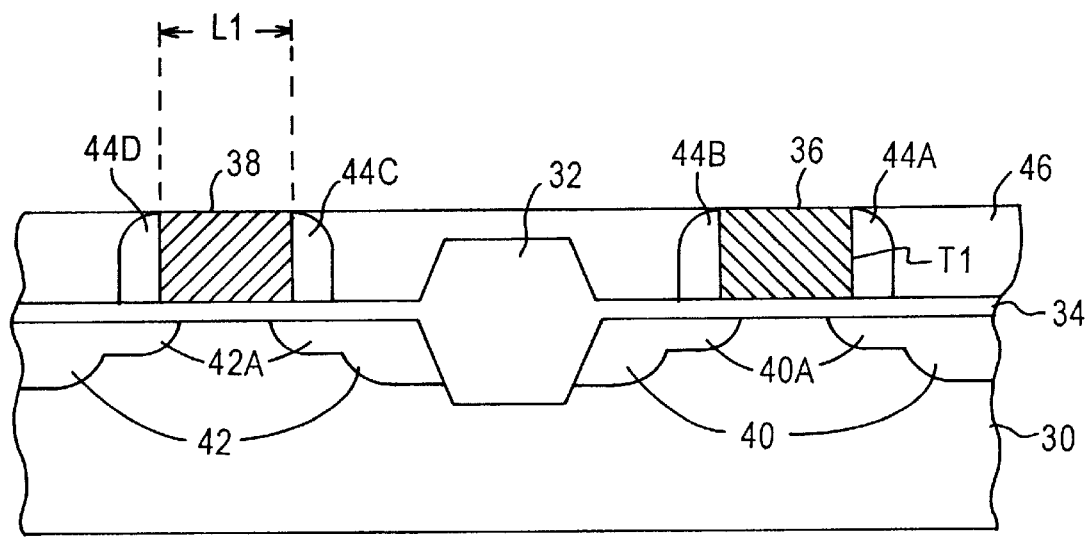
FIGS. 3 through 7 are cross-sectional views schematically depicting a MOS device according to sequential phases of a method in accordance with an embodiment of the present invention.

Embodiments of the present invention are illustrated in FIGS. 3–7. As illustrated in FIG. 3, a field oxide area 32 is formed in a semiconductor substrate 30, as by STI or LOCOS. A gate oxide layer 34 is formed, as by thermal oxidation, on the surface of substrate 30, followed by formation of conductive gate electrodes 36 and 38, such as by deposition of a polysilicon layer, masking of the polysilicon layer, and etching. Gate electrodes 36 and 38 are typically formed at a thickness (T1) of about 1,000 Å to about 2,000 Å and a length or width (L1) of about 100 nm to about 300 nm. Gate 36 will be associated with source/drain regions formed by implantation of n-type impurities, and gate 38 will be associated with source/drain regions formed by implantation of p-type impurities.

N-type impurities NLDD, such as arsenic, phosphorus and/or other materials used to enhance transistor characteristics, are then implanted, as by ion implantation, in substrate 30 to form n-type lightly or moderately doped source/drain extension implants, which form n-type stepped source/drain implants 40A in conjunction with n-type moderate or heavy source/drain implants 40. Likewise, P-type impurities PLDD, such as boron and/or other materials used to enhance transistor characteristics, are then implanted, as by ion implantation, in substrate 30 to form p-type lightly or moderately doped source/drain extension implants 42A which form p-type stepped source/drain implants in conjunction with p-type moderate or heavy source/drain implants 42.

A layer of an insulating material, such as silicon dioxide or silicon nitride, is then deposited, as by LPCVD or thermally grown, and then anisotropically etched to form sidewall spacers 44A–44D on the side surfaces of gate electrodes 36 and 38. After the etching procedure, sidewall spacers 44A–44D preferably extend from the gate electrodes from about 75 Å to about 300 Å.

N-type impurities NS/D, such as arsenic, phosphorus and/or other materials used to enhance transistor characteristics, are then implanted, as by ion implantation, in substrate 30 to form n-type moderate or heavy source/drain implants 40. Likewise, P-type impurities PS/D, such as boron and/or other materials used to enhance transistor characteristics are also, as by ion implantation, in substrate 30 to form p-type moderate or heavy source/drain implants 42.

As in conventional MOS processing, impurities NLDD and PLDD are implanted at a dosage about 1–2 orders of magnitude lower than that of impurities NS/D and PSID, and at a substantially lower energy; e.g., less than about 10 keV versus about 30 keV for NS/D and less than about 10 keV versus about 20 keV for PS/D.

Substrate 30 is then heated to diffuse and electrically activate implanted impurities NLDD, PLDD, NS/D and PS/D in stepped source/drain implants 40 and 42, as by rapid thermal annealing at a temperature of about 900° C. to about 1100° C. for less than about 30 seconds. Preferably, NS/D and NLDD implants are performed at a higher energy than the PS/D and PLDD implants, resulting in the n-type stepped source/drain implants 40 being deeper than p-type stepped source/drain implants 42 prior to the heating step. N-type impurities diffuse less quickly when heated than p-type impurities. Thus, by employing higher energy to form n-type stepped source/drain implants 40 deeper than p-type stepped source/drain implants 42, the depths of both n-type and p-type junctions are optimized after the heating step, resulting in improved device performance.

Insulating layer 46 is then deposited on the substrate to protect gate oxide layer 34, field oxide area 32 and sidewall spacers 44A–44D. Insulative layer 46 can be any material capable of protecting the underlying layers from subsequent etching processes. For example, insulative layer 46 can be a conformal layer comprising silicon nitride, silicon oxynitride, and/or silicon oxides or any low dielectric film such as FSG, HSQ, etc. The insulative layer can be deposited as by vacuum deposition techniques as, for example, low pressure chemical vapor deposition (LPCVD), plasma enhanced chemical vapor deposition (PECVD) or rapid thermal chemical vapor deposition (RTCVD) to a thickness above or below or at the upper surface of gate electrodes 36 and 38.

In an embodiment of the present invention, insulating layer 46 is deposited above the upper surface of gate electrodes 36 and 38 and subsequently planarized to expose the upper surfaces of the gate electrodes 36 and 38, resulting in the structure show in FIG. 3. Insulating layer 46 can be planarized employing plasma etching or by chemical mechanical polishing (CMP). Polishing is complete when insulative layer 46 is level with the upper surface of gate electrodes 36 and 38. When employing CMP, complete polishing can be realized by monitoring for an increase resistance which is encountered in performing the polishing action on the relatively harder gate electrodes in comparison to the relatively softer insulative layer 46. Alternatively, polishing can be continue beyond the original thickness of gate electrodes 36 and 38 to achieve a reduced thickness for the gate electrodes. In an embodiment of the present invention, insulating layer 46 and gate electrodes 36 and 38 are planarized to a thickness of no greater than about 2,000 Å, e.g. to a thickness from about 1,800 Å to about 800 Å.

Figure 4:
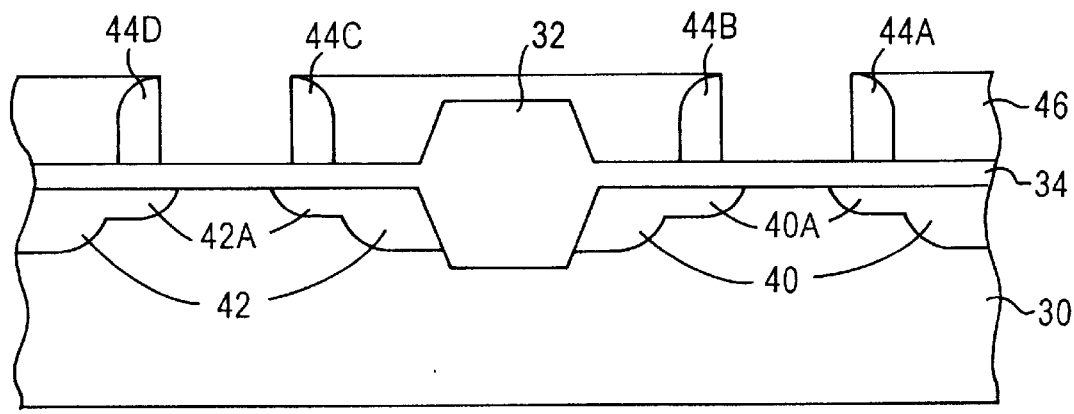

After depositing and optionally planarizing insulating layer 46, gate electrodes 36 and 38 are removed, as show in FIG. 4. In accordance with the present invention, gate electrodes 36 and 38 can be selectively removed by reactive ion etching, plasma etching, or wet etching. The choice of etching and etching parameters are selected so that the etchant is highly selective to gate electrodes 36 and 38.

In an embodiment of the present invention, substrate 30 comprising polysilicon gate electrodes is placed in an etch chamber and exposed to an etchant comprising a fluoride of xenon. In practicing the invention, substrate 30 is placed in an etch chamber and the atmosphere removed. A stream of $XeF_2$ mixed with nitrogen is then introduced to the etch chamber to attain a static pressure of about one atmosphere, e.g. to about ±5 psi of one atmosphere. Substrate 30 is exposed from about 1 second to about 20 seconds, e.g. 10 seconds, to the $XeF_2$ etchant mixture in the etch chamber. Thereafter, the etchant mixture is removed by evacuating the chamber and flushing the chamber with nitrogen or air. If necessary, the etch chamber can be filled another stream of $XeF_2$ mixed with nitrogen to repeat the etching step.

The $XeF_2$ is highly selective to silicon relative to the insulative layer and anisotropically etches the polysilicon gate electrodes. In the foregoing, $XeF_2$ is used as a reactive fluorine compound. Alternatively, reactive fluorine compounds can also be employed together with $XeF_2$ or in place of $XeF_2$, such as $ClF$, $ClF_3$, $ClF_5$, $BrF$, $BrF_3$, $BrF_5$, $KrF$, $XeF$, or mixtures thereof.

Once the original gate electrodes have been removed, a second gate electrode can be formed by depositing a conductive layer comprising a metal, such as aluminum, copper, titanium, tungsten, silver, gold, or alloys thereof. The conductive layer can also comprise polysilicon or suicides of the above-mentioned metals with silicon. The conductive layer can be deposited by vacuum deposition techniques to completely fill the void resulting from the removal of the first gate electrode. Thereafter, the conductive layer can be etched employing photolithographic and etching techniques or polished to form the second gate electrode. In an embodiment of the present invention, the second gate electrode is formed by depositing a conductive layer and polishing the conductive layer, as by chemical mechanical polishing (CMP). The conductive layer can be polished back to underlying insulating layer 46 thereby electrically isolating the gate electrodes. The CMP process can be continued to reduce the new conductive gate and insulating layer as necessary to optimize integration of further steps such as contact layer etching, stress management, or other material/device properties.

Alternatively, exposed gate oxide layer 34 can be removed prior to depositing the second gate electrode. In an embodiment of the present invention, the gate oxide layer can be removed by techniques selected for the removal of oxide materials. For example, gate oxide layer 34 can be removed by wet or plasma oxide etching, e.g., by employing hydrofluoric acid or a $CF_4$ plasma, respectively. After removal of exposed gate oxide layer 34, a second dielectric material can be deposited, as for example, a high dielectric material. Alternatively, a second dielectric layer can be deposited over gate oxide layer 34.

Figure 5:
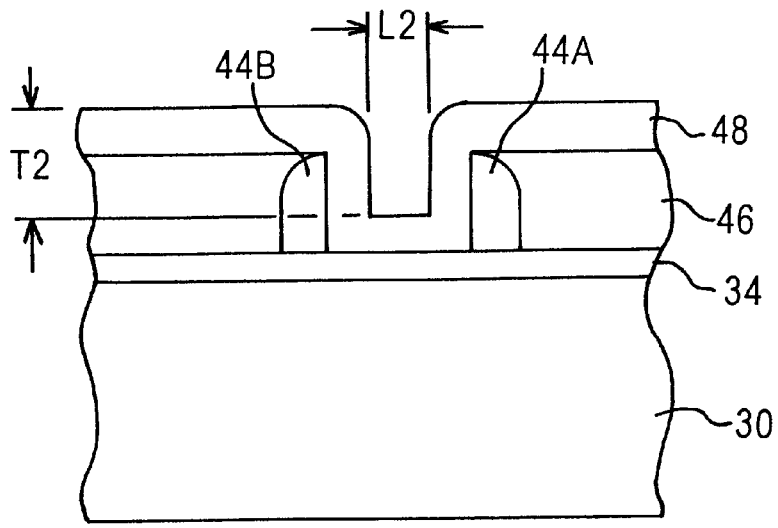

The present invention, therefore, enables control of the underlying dielectric layer of a MOS device. In an embodiment of the present invention, a dielectric layer comprising one or more layers of silicon oxide, silicon nitride, silicon oxynitride, tantalum oxide, hafnium oxide is formed in place of or in addition to the gate oxide. As shown in FIG. 5, dielectric layer 48 can be deposited as a conformal layer over insulative layer 46 and gate oxide layer 34. For example, a tantalum pentoxide dielectric film can be formed by means of CVD on the surface of the structure.

In an embodiment of the present invention, a dielectric layer is deposited on the substrate prior to depositing the second gate electrode. Referring to FIG. 5, dielectric layer 48 can be deposited to reduce the dimensions of the subsequently deposited second gate electrode relative to the first gate electrode. The present invention, thus, enables control of the length and thickness of a gate electrode in a MOS device.

As shown in FIG. 5, the thickness, T2, available for the second gate electrode is dependent, in part, upon the thickness of the dielectric layer 48. Further, the length, L2, available for the second gate electrode is likewise dependent on the thickness of dielectric layer 48. In an embodiment of the present invention, dielectric layer 48 is formed from about 15 Å to about 100 Å thereby reducing the gate length by about 3 nm to about 20 nm. In an embodiment of the present invention, dielectric layer 48 is deposited to provide a second gate electrode having a length of from about 80 nm to about 150 nm.

Figure 6:
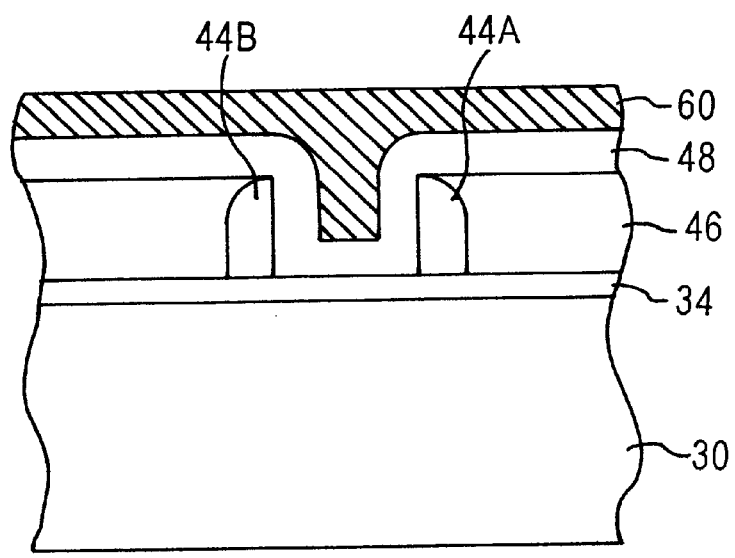

A second gate electrode can be formed by deposited a conformal film comprising a conductive material over the structure. As shown in FIG. 6, conductive film 60 is formed overlying dielectric layer 48 and completely fills the void resulting from the removal of the first gate electrode. Film 60 comprises a conductive material, e.g. a metal or doped polysilicon or alloys thereof. The second gate electrode is formed from conductive layer 60 by employing photolithographic and etching techniques or by employing polishing techniques.

Figure 7:
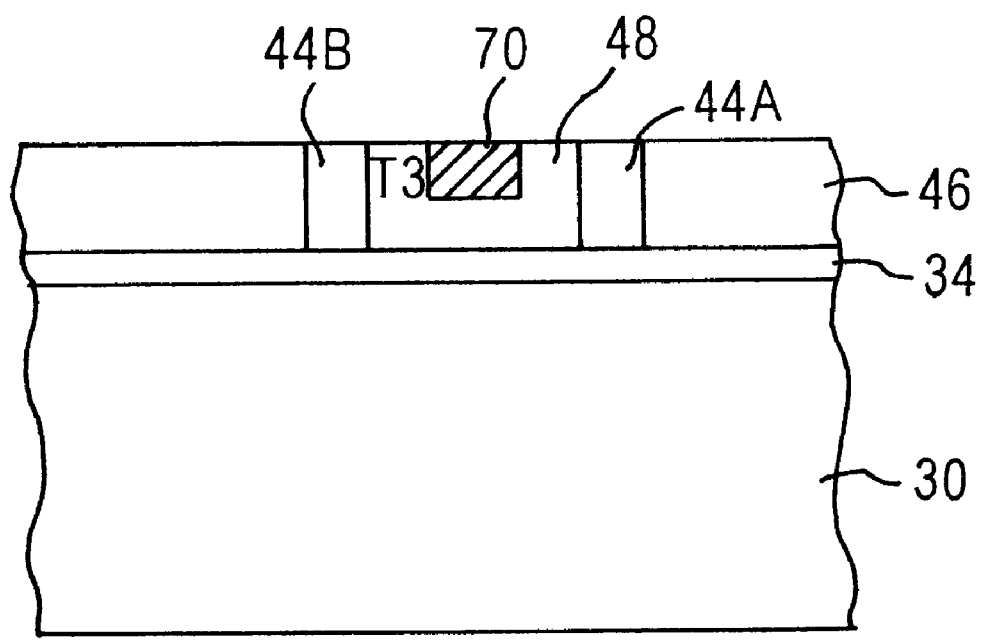

In accordance with the present invention, the second gate electrode can be formed by planarizing conductive film 60, as by chemical mechanical polishing. The thickness of the second gate electrode depends, in part, on the extent of planarization. An embodiment is illustrated in FIG. 7 and comprises gate oxide layer 34 on substrate 30, dielectric layer 48 on gate oxide 34, insulating layer 46 on gate oxide 34, sidewall spacer layers 44A and 44B also on gate oxide 34 and adjacent to dielectric layer 48, and second gate electrode 70 on dielectric layer 48. As shown in FIG. 7, second gate electrode 70 is formed by polishing conductive film 60 to the level of the insulating layer 46.

As shown in FIG. 7, the thickness, T3, available for the second gate electrode is dependent, in part, upon the thickness of the dielectric layer 48 and the extent of polishing conductive film 60. In an embodiment of the present invention, second gate electrode has a thickness of from about 1,500 Å to about 400 Å.

Additional process steps, such as the formation of metal contacts to electrically connect gate electrodes, formation of insulative layers to isolate the various features, and formation of inter-level metallization, complete and integrate the device.

The present invention is applicable to the manufacture of various types of semiconductor devices, particularly high density semiconductor devices having a design rule of about 0.18 μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming a first dielectric layer on a substrate;

forming a first gate electrode on the first dielectric layer, wherein the first gate electrode has an upper surface;

depositing an insulating layer on the substrate to protect the substrate;

removing the first gate electrode by selectively etching the first gate electrode with a reactive fluoride compound;

forming a second dielectric layer on the first dielectric layer; and forming a second gate electrode in place of the first gate electrode.

2. The method according to claim 1, comprising polishing the insulating layer to expose the upper surface of the first electrode prior to removing the first gate electrode.

3. The method according to claim 1, comprising depositing a high dielectric constant material as the second dielectric layer.

4. The method according to claim 3, comprising depositing an oxide of tantalum as the second dielectric layer.

5. The method according to claim 6, comprising depositing the second dielectric layer to a thickness of about 15 Å to about 100 Å.

6. The method according to claim 1, comprising depositing the second dielectric layer prior to depositing the second gate electrode to reduce the length of the second gate electrode relative to the first gate electrode.

7. The method according to claim 1, comprising depositing the second dielectric layer prior to depositing the second gate electrode to provide the length of the second gate electrode from about 80 nm to about 150 nm.

8. The method according to claim 1, comprising planarizing the second gate electrode to a thickness of from about 1,500 Å to about 400 Å.

9. The method according to 1, comprising forming the second gate electrode by depositing aluminum, copper, tungsten, titanium, gold, silver, or alloys thereof.

10. The method according to claim 1, comprising removing the first gate electrode by etching with a fluoride of xenon as the reactive fluoride compound.

11. A method of forming a semiconductor structure, the method comprising:

forming a gate oxide layer on a surface of a semiconductor substrate;

forming a first gate electrode on the gate oxide layer;

forming an insulating layer on the substrate to protect the substrate;

removing the first gate electrode by selectively etching the first gate electrode with a reactive fluoride compound;

removing the gate oxide layer;

forming a dielectric layer on the substrate in place of the gate oxide layer; and forming a second gate electrode on the dielectric layer.

12. The method according to claim 11, comprising removing the first gate electrode by etching with a fluoride of xenon as the reactive fluoride compound.

13. The method according to claim 11, comprising depositing a metal to form the second gate electrode.

14. The method according to claim 11, comprising removing the gate oxide layer by wet or plasma etching.

15. The method according to claim 11, comprising forming one or more layers of silicon oxide, silicon nitride, silicon oxynitride, tantalum oxide, or hafnium oxide as the dielectric layer.

16. The method according to claim 11, comprising polishing the insulating layer to expose the first gate electrode prior to removing the first gate electrode.

17. The method according to claim 11, comprising depositing the second dielectric layer to a thickness of about 15 Å to about 100 Å.

18. The method according to claim 11, comprising depositing the dielectric layer prior to depositing the second gate electrode to reduce the length of the second gate electrode relative to the first gate electrode.

19. The method according to claim 11, comprising depositing the dielectric layer prior to depositing the second gate electrode to provide the length of the second gate electrode from about 80 nm to about 150 nm.

20. The method according to claim 11, comprising planarizing the second gate electrode to a thickness of from about 1,500 Å to about 400 Å.

* * * * *